(12) United States Patent  
Takahashi

(10) Patent No.: US 7,746,141 B2
(45) Date of Patent: Jun. 29, 2010

(54) DELAY CIRCUIT

(75) Inventor: Hiroyuki Takahashi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/759,309

(22) Filed: Jun. 7, 2007

(65) Prior Publication Data

US 2007/0296479 A1 Dec. 27, 2007

(30) Foreign Application Priority Data

Jun. 26, 2006 (JP) ............................. 2006-174766

(51) Int. Cl.
*H03H 11/26* (2006.01)
(52) U.S. Cl. .................... 327/261; 327/264; 327/268
(58) Field of Classification Search ......... 327/261–264, 327/268, 269, 271, 276–278, 283, 284, 551, 327/554
See application file for complete search history.

(56) References Cited

U.S. PATENT DOCUMENTS

| 4,707,626 | A | * | 11/1987 | Inoue | ......................... 327/172 |
| 4,868,525 | A | | 9/1989 | Dias | |
| 5,055,713 | A | * | 10/1991 | Watanabe et al. | .............. 326/27 |
| 5,068,553 | A | | 11/1991 | Love | |
| 5,319,607 | A | | 6/1994 | Fujii et al. | |
| 6,320,443 | B1 | * | 11/2001 | Jeong | ......................... 327/264 |
| 6,541,945 | B1 | * | 4/2003 | Smith | ......................... 323/269 |
| 6,661,272 | B2 | * | 12/2003 | Kim et al. | ................... 327/291 |
| 2003/0231034 | A1 | | 12/2003 | Koch, II et al. | |
| 2004/0212408 | A1 | | 10/2004 | Indoh | |

FOREIGN PATENT DOCUMENTS

| JP | 63-217820 | 9/1988 |
| JP | 10-270988 | 10/1998 |
| JP | 2000-209077 | 7/2000 |
| JP | 2003-273712 | 9/2003 |

OTHER PUBLICATIONS

Chinese Patent Office issued a Chinese Office Action dated Feb. 12, 2010. Application No. 200710112294.

* cited by examiner

*Primary Examiner*—An T Luu
(74) *Attorney, Agent, or Firm*—Young & Thompson

(57) ABSTRACT

A delay circuit includes a delay time setting circuit to set a delay time of an output signal with respect to an input signal, a first transistor connected to an input terminal of the delay time setting circuit and configured to set a first voltage to the input terminal of the delay time setting circuit and a second transistor connected to an output terminal of the delay time setting circuit and configured to reset the output terminal of the delay time setting circuit to a second voltage and clear the reset of the output terminal of the delay time setting circuit after the first voltage is set.

10 Claims, 16 Drawing Sheets

|  | BP | BN |
|---|---|---|
| LARGE DELAY | H(OFF) | L(OFF) |
| INTERMEDIATE DELAY | L(ON) | L(OFF) |
| INTERMEDIATE DELAY | H(OFF) | H(ON) |
| SMALL DELAY | L(ON) | H(ON) |

Fig. 10

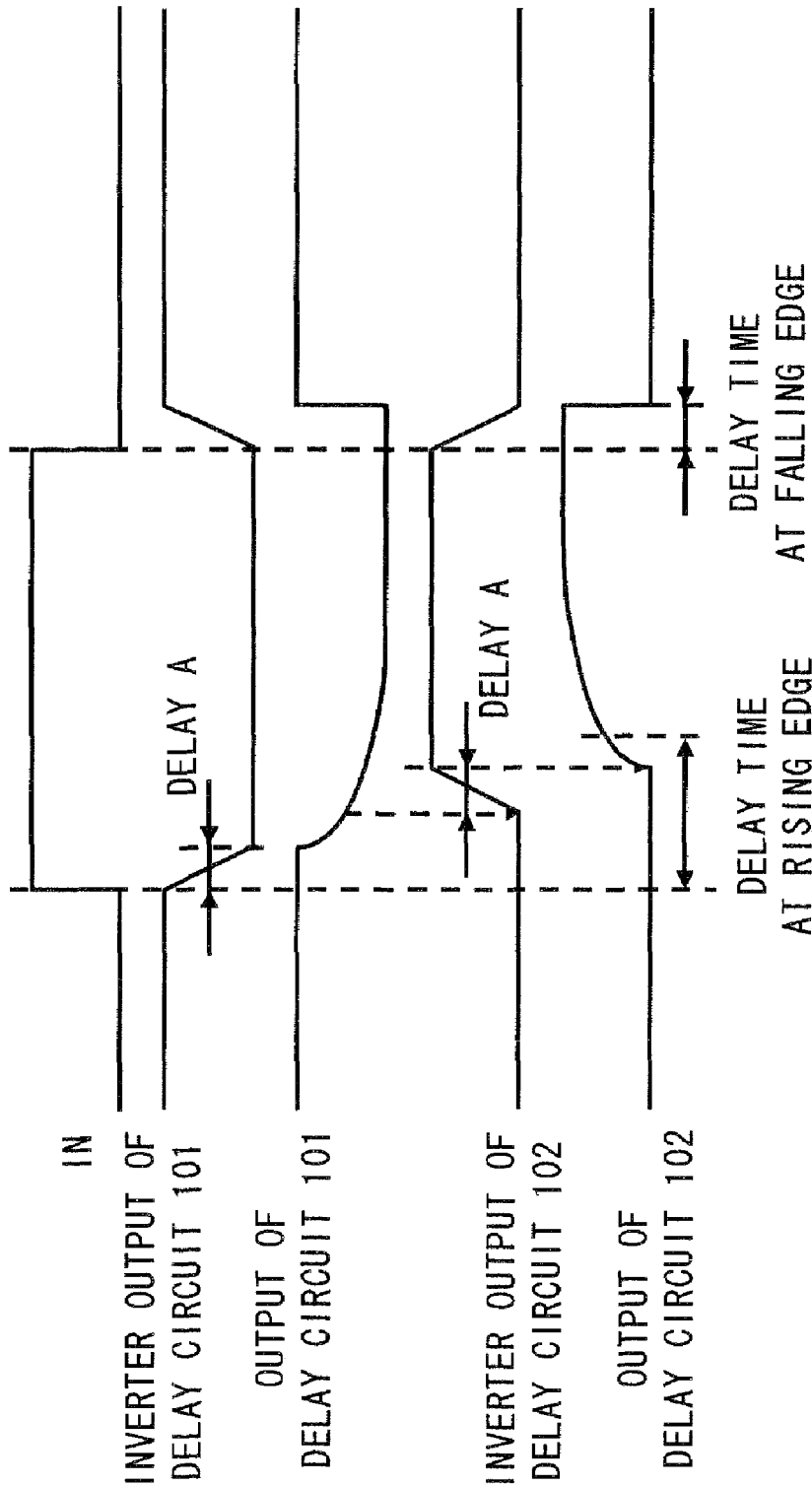

DELAY CIRCUIT

BACKGROUND OF THE INVENTION

1. Field of the Invention

The present invention relates to a delay circuit and, particularly, to a delay circuit having delay characteristics that are dependent on temperature.

2. Description of Related Art

A semiconductor device generally has temperature characteristics such that characteristics vary with temperature. Signal delay characteristics are one of such temperature characteristics. The signal delay characteristics exhibit a positive temperature coefficient showing an increase in delay with an increase in temperature if an operating power supply voltage is high. If, on the other hand, an operating power supply voltage is low, the delay characteristics exhibit a negative temperature coefficient showing an increase in delay with a decrease in temperature. A semiconductor device includes a delay circuit for adjusting the signal timings. In a delay circuit, the delay characteristics also exhibit a negative temperature coefficient if an operating power supply voltage is low.

Recent semiconductor devices operate at a low operating power supply voltage. Particularly, there is an increasing demand for the reduction of power consumption through the use of a lower voltage for a memory of a portable device, a logic device, or the like. Accordingly, the negative temperature coefficient of the signal delay characteristics becomes more pronounced in such semiconductor devices. A large negative temperature coefficient of the signal delay characteristics causes difficulty in timing adjustment with an external input signal, which requires a decrease in operating speed. A technique for reducing a negative temperature coefficient of the delay characteristics of a delay circuit is disclosed in Japanese Unexamined Patent Application Publication No. 2003-273712 (which is referred to hereinafter as a related art).

A delay circuit is typically configured as a multi-stage delay circuit which includes a plurality of delay circuits connected in multiple stages. FIG. 15 shows a circuit diagram of a multi-stage delay circuit 100 according to the related art. As shown in FIG. 15, the multi-stage delay circuit 100 includes delay circuits 101 and 102 which are connected in series. In each of the delay circuits 101 and 102, a resistor R and a capacitor which is composed of a MOS transistor MC are connected to the output of an inverter INV.

The capacitor which is used in the multi-stage delay circuit 100 is formed using a parasitic capacitor of a MOS transistor MC. A capacitance value of the capacitor is small when the MOS transistor MC is nonconductive and it is large when the MOS transistor MC is conductive. A threshold voltage of the MOS transistor MC has the temperature characteristics.

For example, a threshold voltage of a MOS transistor MC which is composed of a PMOS transistor becomes higher as a temperature increases. On the other hand, a threshold voltage of a MOS transistor MC which is composed of an NMOS transistor becomes lower as a temperature increases. Thus, a voltage range where a capacitance value of a capacitor is large becomes wider as a temperature increases. Accordingly, a time constant that is determined by the resistor R and the capacitor becomes higher as a temperature increases. Further, a delay time of an output signal of the delay circuits 101 and 102 becomes longer as a temperature increases. Thus, the multi-stage delay circuit 100 reduces a negative temperature coefficient of the delay characteristics of the delay circuit as a whole with the use of the temperature characteristics of the parasitic capacitor of the MOS transistor MC.

The multi-stage delay circuit 100 also includes reset transistors RTr. The reset transistor RTr of the delay circuit 101 causes an output signal of the delay circuit 101 to rise rapidly. On the other hand, the reset transistor RTr of the delay circuit 102 causes an output signal of the delay circuit 102 to fall rapidly. Thus, the reset transistor RTr causes either the rise or fall of the output signals of the delay circuits 101 and 102 to occur rapidly.

In the multi-stage delay circuit 100, a delayed signal is input to an inverter INV of a delay circuit which is connected in the subsequent stage. Further, the delay circuits are the inversion of each other. For example, if a delay circuit in one stage delays a rising edge, the delay circuit outputs a falling edge with a delay at the rising edge of an input signal. Then, a delay circuit in the subsequent circuit outputs a rising edge with a delay at the falling edge of the signal from the delay circuit in the previous stage.

However, the present inventors have recognized the followings. In the multi-stage delay circuit 100, the reset transistor RTr becomes nonconductive in response to the input signal IN. Thus, the timing when the output of each delay circuit starts changing corresponds to a timing when the output of the inverter INV changes. The output of the inverter INV of the delay circuit 101 in the first stage changes when the PMOS transistor P1 becomes nonconductive after the NMOS transistor N1 becomes conductive. The NMOS transistor N1 is a high-threshold transistor, and the PMOS transistor P1 is a low-threshold transistor. A delay occurs until the PMOS transistor P1 becomes nonconductive after the NMOS transistor N1 becomes conductive. The delay causes a delay in the inverter. On the other hand, the output of the inverter INV of the delay circuit 102 in the subsequent stage changes when the NMOS transistor N2 becomes nonconductive after the PMOS transistor P2 becomes conductive. The PMOS transistor P2 is a high-threshold transistor, and the NMOS transistor N2 is a low-threshold transistor. A delay occurs until the NMOS transistor N2 becomes nonconductive after the PMOS transistor P2 becomes conductive. The delay causes a delay in the inverter.

FIG. 16 shows a timing chart of the operation of the multi-stage delay circuit 100 according to the related art. As shown in FIG. 16, the multi-stage delay circuit 100 generates a delay time A after the input of the inverter INV of each delay circuit changes, which changes its output. Because the delay time A is a delay of the inverter INV, it has the temperature characteristics in accordance with the temperature characteristics of the transistor threshold. The temperature characteristics of the delay time A exhibits a negative temperature coefficient as in other circuits. If the negative temperature coefficient of the delay time A is larger than a positive temperature coefficient of a delay time that is generated by a resistor and a capacitor, it is unable for the multi-stage delay circuit 100 to generate a delay time of the entire circuit which exhibits a positive temperature coefficient. In other words, in the delay circuit of the related art, a positive temperature coefficient of the delay time which is generated by a resistor and a capacitor is cancelled by a negative temperature coefficient of the delay time of the inverter INV. Further, because the temperature characteristics of the delay time which is generated by the multi-stage delay circuit 100 are a mixture of a negative temperature coefficient of the delay time of the inverter INV and a positive temperature coefficient of the delay time generated by a resistor and a capacitor, the calculation of a delay time is complicated and it is difficult to set a delay time accurately.

SUMMARY

In one embodiment, there is provided a delay circuit which includes a delay time setting circuit, a first transistor, and a second transistor. The delay time setting circuit sets a delay time of an output signal with respect to an input signal. The first transistor is connected to an input terminal of the delay time setting circuit. The first transistor sets a first voltage to the input terminal of the delay time setting circuit. The second transistor is connected to an output terminal of the delay time setting circuit. The second transistor resets the output terminal of the delay time setting circuit to a second voltage and clears the reset of the output terminal of the delay time setting circuit after the first voltage is set.

In the delay circuit of one embodiment of the present invention, a second transistor resets an output terminal of a delay time setting circuit to a second voltage (e.g. a reset voltage), and a first transistor sets a first voltage (e.g. an input voltage) to an input terminal of the delay time setting circuit. After that, the reset of the output terminal of the delay time setting circuit is cleared. In response to the reset clear, the output voltage of the delay time setting circuit changes from the reset voltage to the input voltage. At this time, the output voltage of the delay time setting circuit shifts to a voltage at which a change in the output voltage is recognized according to a set delay time. Thus, the delay circuit clears the reset after setting the input voltage to the delay time setting circuit, and then lets the output signal of the delay time setting circuit start changing upon clearing the reset. A delay time which is generated in the delay circuit of one embodiment of the invention thereby does not contain a delay time caused by an inverter INV unlike in a delay circuit of a related art, so that it is substantially the same as a time set by the delay time setting circuit. It is therefore possible to calculate a delay time generated by a delay circuit of one stage on the basis of a reset clear timing. Further, it is possible to set a delay time correctly by accurately designing a basic timing and a delay time in the design phase. Furthermore, it is possible to set a delay time generated in the delay time to exhibit a positive temperature coefficient by setting a delay time generated by the delay time setting circuit to exhibit a positive temperature coefficient.

In addition, if the output signal of the delay time setting circuit is used as a reset clear signal of a delay circuit connected in the subsequent stage and a plurality of delay circuits are connected in multiple stages, a delay time of the entire circuit equals a sum of a delay time which is set by a delay time setting circuit of each stage. The delay circuit of one embodiment of the present invention can thereby set a large delay time with a positive temperature coefficient.

The delay circuit of the present invention enables accurate setting of a signal delay time and allows the signal delay characteristics to exhibit a positive temperature coefficient.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 10 is a view showing the relationship between the state of a switch and a delay time in a multi-stage delay circuit according to the third embodiment;

FIG. 16 is a view showing a timing chart of a multi-stage delay circuit according to the related art.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
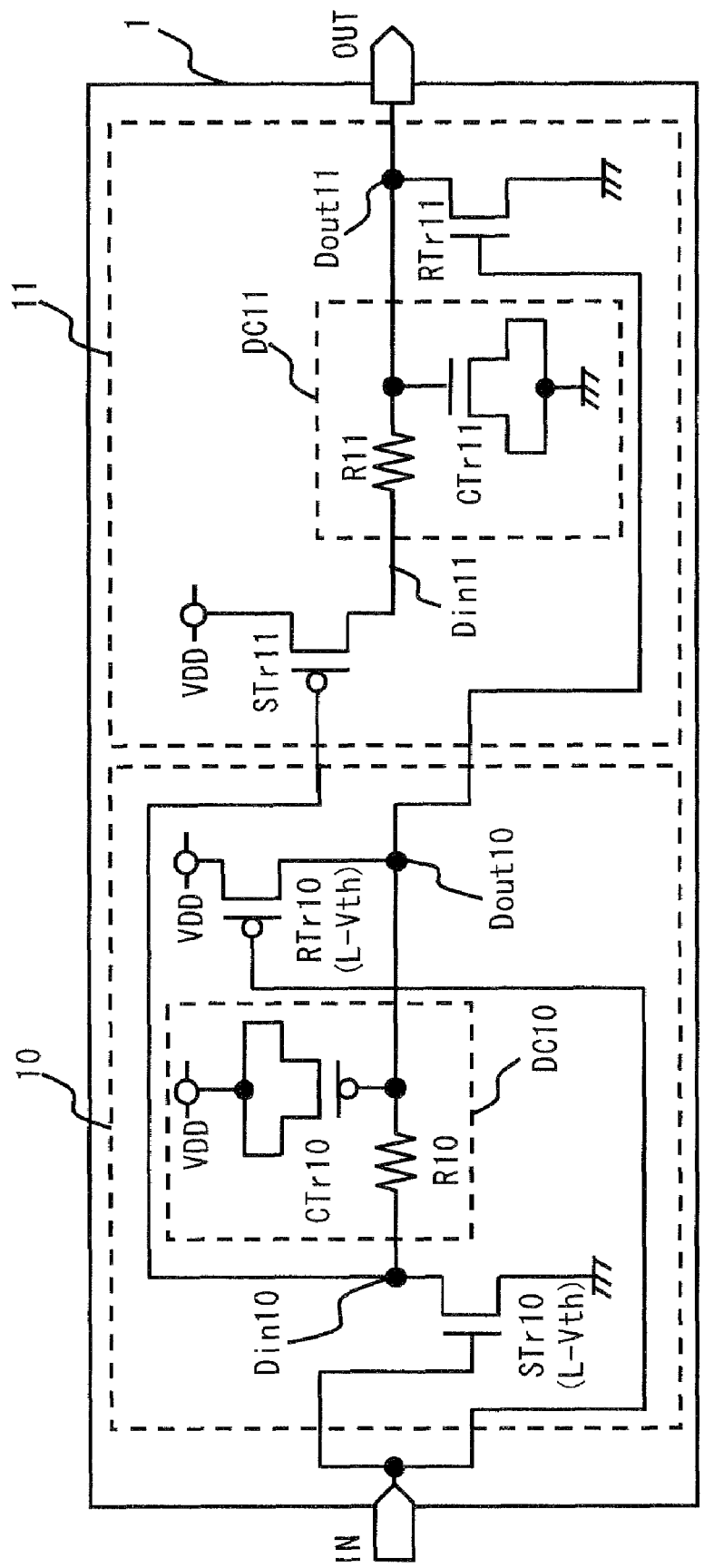
FIG. 1 is a circuit diagram of a multi-stage delay circuit according to a first embodiment of the present invention.

Exemplary embodiments of the present invention are described hereinafter with reference to the drawings. FIG. 1 shows a circuit diagram of a multi-stage delay circuit 1 according to a first embodiment of the present invention. As shown in FIG. 1, the multi-stage delay circuit 1 includes delay circuits 10 and 11 that are connected in series, for example. Each of the delay circuits 10 and 11 includes first and second transistors and a delay time setting circuit.

The first transistor of the delay circuit 10 is a set transistor STr10, which is composed of an NMOS transistor, for example. The drain of the set transistor STr10 is connected to the input of the delay time setting circuit DC10, and the source is connected to the ground voltage VSS. An input signal IN is input to the gate of the set transistor STr10. For the set transistor STr10 of the first embodiment, a transistor having a lower threshold voltage Vth than that of a standard transistor produced in a manufacturing process is used.

The second transistor of the delay circuit 10 is a reset transistor RTr10, which is composed of a PMOS transistor, for example. The drain of the reset transistor RTr10 is connected to the output of the delay time setting circuit DC10, and the source is connected to the power supply voltage VDD.

An input signal IN is input to the gate of the reset transistor RTr10. For the reset transistor RTr10 of the first embodiment, a transistor having a lower threshold voltage Vth than that of a standard transistor produced in a manufacturing process is used.

The delay time setting circuit DC10 of the delay circuit 10 includes a resistor R10 and a capacitor transistor CTr10 (which is a PMOS transistor in the delay circuit 10). One end of the resistor R10 is an input terminal Din10 of the delay time setting circuit DC10. The other end of the resistor R10 is an output terminal Dout10 of the delay time setting circuit DC10. Further, the gate of the capacitor transistor CTr10 is connected to the other end of the resister R10. The source and the drain of the capacitor transistor CTr10 are connected to the power supply voltage VDD. The capacitance value of the capacitor transistor CTr10 is described in detail later.

The first transistor of the delay circuit 11 is a set transistor STr11, which is composed of a PMOS transistor, for example. The drain of the set transistor STr11 is connected to the input of the delay time setting circuit DC11, and the source is connected to the power supply voltage VDD. An input signal of the delay time setting circuit DC10 is input to the gate of the set transistor STr11. For the set transistor STr11, a transistor having a threshold voltage of a standard transistor produced in a manufacturing process is used.

The second transistor of the delay circuit 11 is a reset transistor RTr11, which is composed of an NMOS transistor, for example. The drain of the reset transistor RTr11 is connected to the output of the delay time setting circuit DC11, and the source is connected to the ground voltage VSS. An output signal of the delay time setting circuit DC10 is input to the gate of the reset transistor RTr11. For the reset transistor RTr11, a transistor having a threshold voltage of a standard transistor produced in a manufacturing process is used.

The delay time setting circuit DC11 of the delay circuit 11 includes a resistor R11 and a capacitor transistor CTr11 (which is an NMOS transistor in the delay circuit 11). One end of the resistor R11 is an input terminal Din11 of the delay time setting circuit DC11. The other end of the resistor R11 is an output terminal Dout11 of the delay time setting circuit DC11, which is connected to an output terminal OUT of the multi-stage delay circuit 1. Further, the gate of the capacitor transistor CTr11 is connected to the other end of the resister R11. The source and the drain of the capacitor transistor CTr11 are connected to the ground voltage VSS. The capacitance value of the capacitor transistor CTr11 is described in detail later.

The capacitor transistors CTr10 and CTr11 form a capacitor with parasitic capacitance of the gate. The capacitance value of the capacitor varies according to the width of a depletion layer that is formed between the source/drain region and the well region which varies with a change in a voltage applied to the gate. For example, if a PMOS transistor is used as the capacitor transistor CTr10, the capacitance value is small when the power supply voltage VDD is applied to the gate and it is large when the ground voltage VSS is applied to the gate. Further, if an NMOS transistor is used as the capacitor transistor CTr11, the capacitance value is small when the ground voltage VSS is applied to the gate and it is large when the power supply voltage VDD is applied to the gate.

Now, the delay time setting circuit DC10 is described hereinafter in detail. In the delay time setting circuit DC10, a first voltage (e.g. an input voltage) is set to the input terminal Din10, and a second voltage (e.g. a reset voltage) is set to the output terminal Dout10. In this condition, when the reset transistor RTr10 clears the reset, an output voltage at the output terminal Dout10 shifts from the reset voltage to the input voltage. At this time, the output voltage changes according to the curve that is set based on a time constant which is determined by a resistance value of the resistor R10 and a capacitance value of the capacitor transistor CTr10. It is preferred to clear the reset state after the input voltage is set. In this embodiment, the set transistor STr10 and the reset transistor RTr10 which are placed in the first stage are low-threshold voltage (Vth) transistors. This enlarges a time difference between the timing to set the input voltage and the timing to clear the reset.

Figure 2:
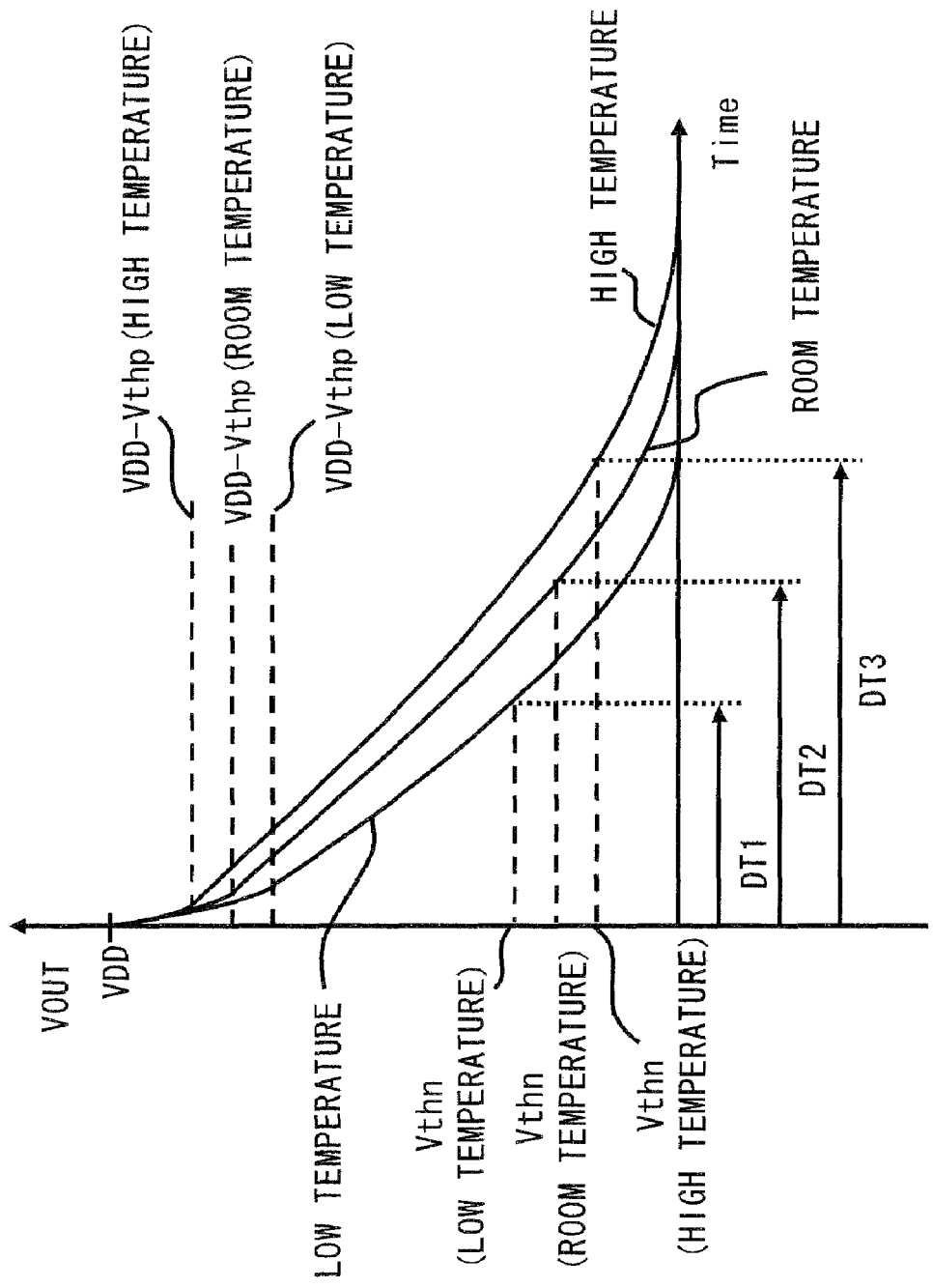
FIG. 2 is a view showing a graph of a change in the output voltage of a delay time setting circuit according to the first embodiment.

FIG. 2 shows an example of curves of the output voltage of the delay time setting circuit DC10. In FIG. 2, curves for three kinds of ambient temperature, high, room, and low temperatures, are illustrated. For example, the high temperature is an upper use temperature limit of a product, and the low temperature is a lower use temperature limit of a product. The room temperature is about 27° C., for example. In the graph of FIG. 2, the vertical axis indicates a voltage value of the output voltage VOUT, and the horizontal axis indicates an elapsed time Time. The point of intersection of the vertical and horizontal axes is a change starting point.

The curve when the ambient temperature is a room temperature is described first. At the time point when an output voltage starts changing, the output voltage is a power supply voltage VDD. Thus, the output voltage falls abruptly according to a time constant which is determined by a low capacitance value and the resistor R10. Then, if the output voltage falls below the threshold voltage Vthp (room temperature) of the PMOS transistor under room temperature, the capacitance value becomes larger. Thus, in the region where the output voltage falls below VDD-Vthp (room temperature), the output voltage decreases gradually. The output of the delay time setting circuit DC10 is input to the gate of the reset transistor RTr11 that is composed of an NMOS transistor. Thus, at the point when the output voltage falls below the threshold voltage Vthn (room temperature) of the NMOS transistor under room temperature, the delay circuit 11 in the subsequent stage recognizes a change in the output of the delay time setting circuit DC10. A time period from the start of a change in the output of the delay time setting circuit DC10 under room temperature to the recognition of a change in the output signal by the next-stage element is referred to as a delay time DT2.

The curve when the ambient temperature is a high temperature is described next. At the time point when an output voltage starts changing, the output voltage is a power supply voltage VDD. Thus, the output voltage falls abruptly according to a time constant which is determined by a low capacitance value and the resistor R10. Then, if the output voltage falls below the threshold voltage Vthp (high temperature) of the PMOS transistor under high temperature, the capacitance value becomes larger. Thus, in the region where the output voltage falls below VDD-Vthp (high temperature), the output voltage decreases gradually. The threshold voltage Vthp (high temperature) of the PMOS transistor under high temperature is higher than the threshold voltage Vthp (room temperature) of the PMOS transistor under room temperature. Therefore, under high temperature, a time period when the output signal changes abruptly is shorter than that under room temperature, and a time period when the output signal changes gradually is longer than that under room temperature. A change in the output signal is recognized at the point when the output voltage falls below the threshold voltage Vthn (high temperature) of the NMOS transistor under high temperature. A time period from the start of a change in the output of the delay time setting circuit DC10 under high temperature to the recognition of a change in the output signal by the next-stage element is referred to as a delay time DT3.

The curve when the ambient temperature is a low temperature is described. At the time point when an output voltage starts changing, the output voltage is a power supply voltage VDD. Thus, the output voltage falls abruptly according to a time constant which is determined by a low capacitance value and the resistor R10. Then, if the output voltage falls below the threshold voltage Vthp (low temperature) of the PMOS transistor under low temperature, the capacitance value becomes larger. Thus, in the region where the output voltage falls below VDD-Vthp (low temperature), the output voltage decreases gradually. The threshold voltage Vthp (low temperature) of the PMOS transistor under low temperature is lower than the threshold voltage Vthp (room temperature) of the PMOS transistor under room temperature. Therefore, under low temperature, a time period when the output signal changes abruptly is longer than that under room temperature, and a time period when the output signal changes gradually is shorter than that under room temperature. A change in the output signal is recognized at the point when the output voltage falls below the threshold voltage Vthn (low temperature) of the NMOS transistor under low temperature. A time period from the start of a change in the output of the delay time setting circuit DC10 under low temperature to the recognition of a change in the output signal by the next-stage element is referred to as a delay time DT1. As shown in FIG. 2, the delay time under each temperature is: DT1<DT2<DT3, such that a delay time becomes longer as the ambient temperature becomes higher.

Figure 3:
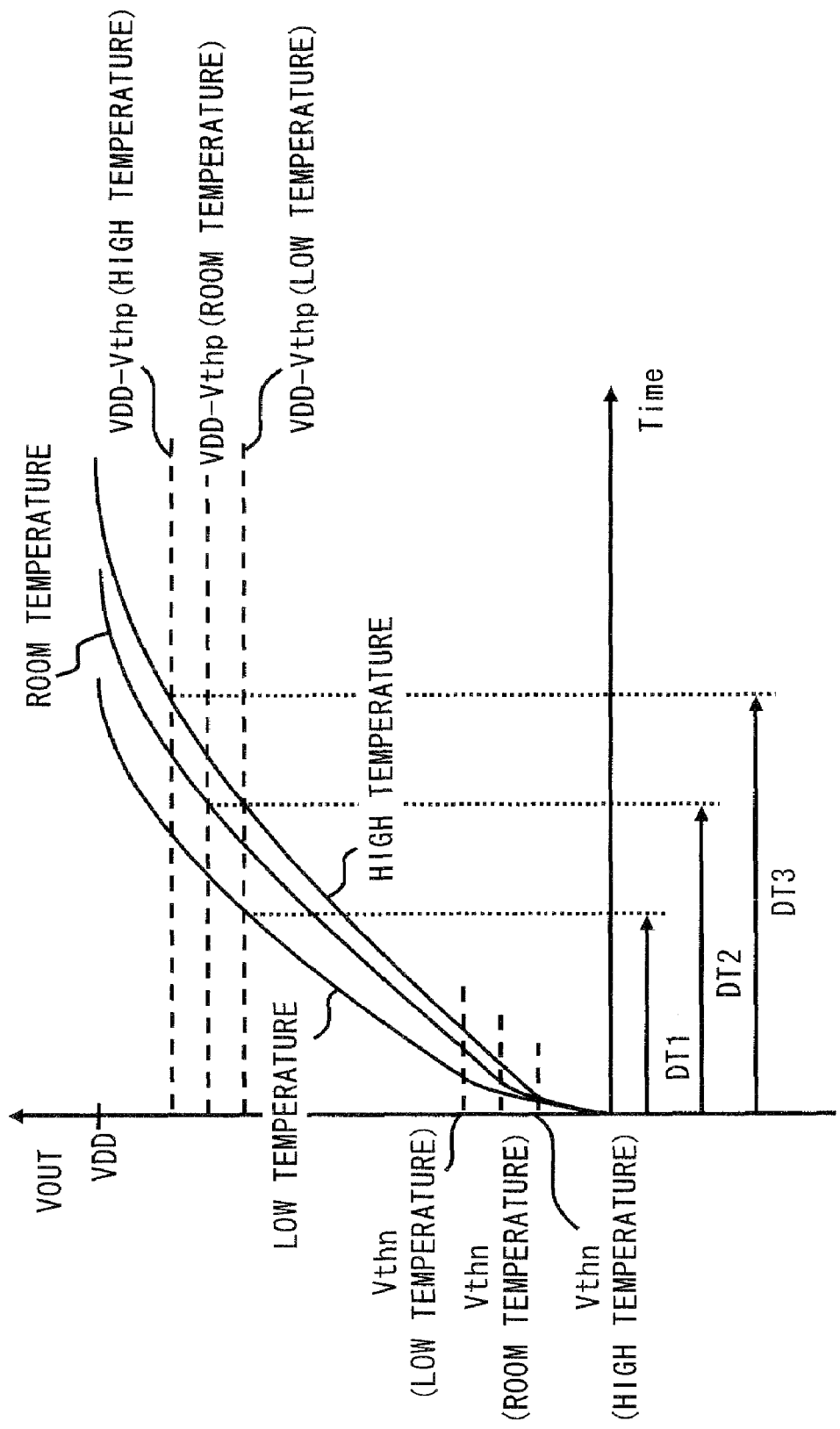
FIG. 3 is a view showing a graph of a change in the output voltage of a delay time setting circuit according to the first embodiment.

FIG. 3 shows an example of curves of the output voltage of the delay time setting circuit DC11. In FIG. 3, like in FIG. 2, curves for three kinds of ambient temperature, high, room, and low temperatures, are illustrated. In the graph of FIG. 3, the vertical axis indicates a voltage value of the output voltage VOUT, and the horizontal axis indicates an elapsed time Time. The point of intersection of the vertical and horizontal axes is a change starting point.

As shown in FIG. 3, the output of the delay time setting circuit DC11 changes from the ground voltage VSS to the power supply voltage VDD, although the output of the delay time setting circuit DC10 changes from the power supply voltage VDD to the ground voltage VSS. The delay time in the delay time setting circuit DC11 under each temperature is: DT1<DT2<DT3, which is the same as in the delay time setting circuit DC10. Thus, a delay time becomes longer as the ambient temperature becomes higher in the delay time setting circuit DC11 just like in the delay time setting circuit DC10.

Figure 4:
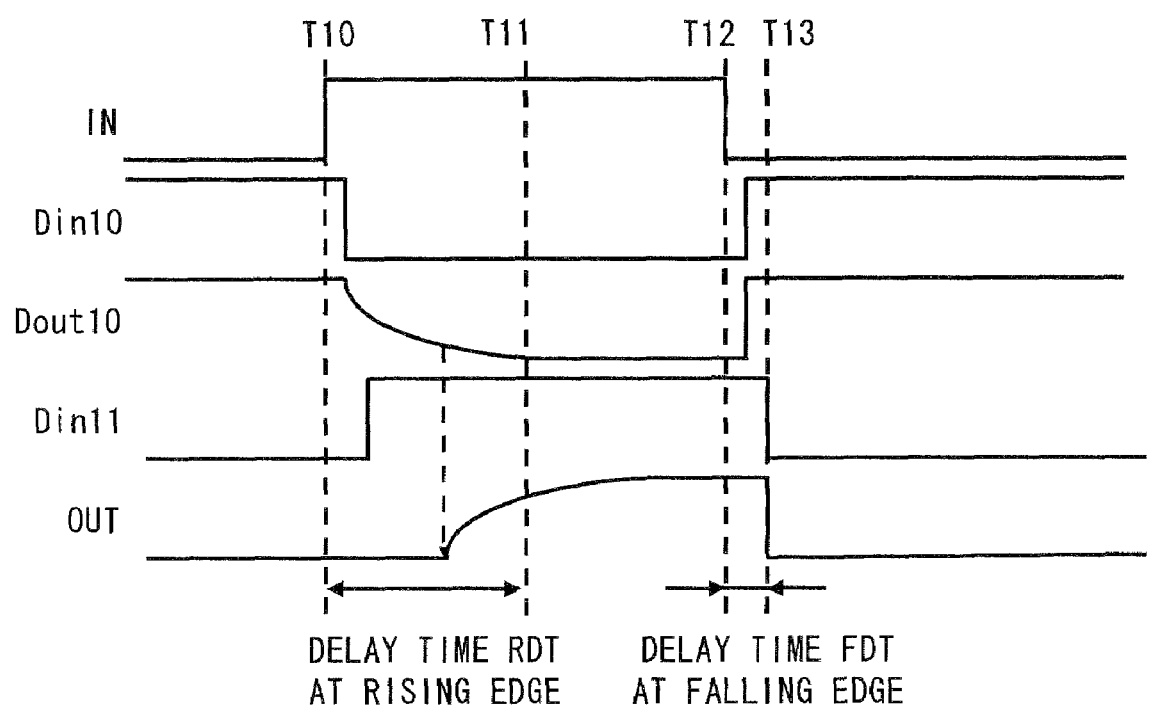
FIG. 4 is a view showing a timing chart of a multi-stage delay circuit according to the first embodiment.

The multi-stage delay circuit 1 of this embodiment is able to use the above characteristics of the delay time setting circuits efficiently. The operation of the multi-stage delay circuit 1 is described hereinafter. FIG. 4 shows the timing chart of the multi-stage delay circuit 1. As shown in FIG. 4, at the timing T10 when the input signal IN rises, the set transistor STr10 becomes conductive, and a first voltage (e.g. an input voltage with a voltage level of the ground voltage VSS) is set to the input terminal of the delay time setting circuit DC10. Then, the reset transistor RTr10 becomes nonconductive to clear the reset of the output of the delay time setting circuit DC10. In the reset state, a second voltage (e.g. a reset voltage with a voltage level of the power supply voltage VDD) is applied to the output terminal of the delay time setting circuit DC10. When the reset is cleared, the output voltage of the delay time setting circuit DC10 changes based on a resistance value of the resistor R10 and a capacitance value of the capacitor transistor CTr10 to become a voltage value of the input voltage. In this embodiment, the threshold voltage of the set transistor STr10 is lower than the threshold voltage of the reset transistor RTr10. Thus, when the input signal IN changes from Low level to High level, the input voltage of the delay time setting circuit DC10 is set first and then the reset is cleared after that.

On the other hand, the set transistor STr11 of the delay circuit 11 becomes conductive when the input voltage of the delay time setting circuit DC10 falls. A first voltage (e.g. an input voltage with a voltage level of the ground voltage VSS) is thereby set to the input terminal of the delay time setting circuit DC11. The reset transistor RTr11 becomes nonconductive when the output voltage of the delay time setting circuit DC10 falls below the threshold voltage of the reset transistor RTr11 to clear the reset of the output terminal of the delay time setting circuit DC11. In the reset state, a second voltage (e.g. a reset voltage with a voltage level of the power supply voltage VDD) is applied to the output terminal of the delay time setting circuit DC11. When the reset is cleared, the output voltage of the delay time setting circuit DC11 starts changing. The output voltage of the delay time setting circuit DC11 changes based on a resistance value of the resistor R10 and a capacitance value of the capacitor transistor CTr11.

The output of the delay time setting circuit DC11 is the output of the multi-stage delay circuit 1. If a PMOS transistor is connected to the output of the multi-stage delay circuit 1, it is determined that a signal has been transmitted at the time point when the output voltage of the multi-stage delay circuit 1 exceeds the threshold voltage of the PMOS transistor. This timing is T11. Thus, a rising edge delay time RDT which is generated by the multi-stage delay circuit 1 is a time period between the timing T10 and the timing T11. The rising edge delay time RDT is substantially equal to a sum of the delay times generated by the delay time setting circuits DC10 and DC11. The delay time generated by the delay time setting circuit is significantly longer than a delay time of the reset transistor RTr.

The operation of the multi-stage delay circuit 1 in response to the falling edge of the input signal is described hereinafter. At the timing T12, the input signal falls. In response thereto, the set transistor STr10 becomes nonconductive and the reset transistor RTr10 becomes conductive. A reset voltage (e.g. the power supply voltage VDD) is thereby set to the output terminal Dout10 of the delay time setting circuit DC10. The input terminal Din10 becomes open, so that the input voltage, which has been set, is released. The reset voltage of the output terminal Dout10 is supplied to the input terminal Din10 through the resistor R.

The set transistor STr11 of the delay circuit 11 becomes nonconductive when the input terminal Din10 of the delay time setting circuit DC10 becomes the power supply voltage VDD. The reset transistor RTr11 becomes conductive when the output terminal Dout10 of the delay time setting circuit DC10 becomes the reset voltage. The reset voltage (e.g. the ground voltage VSS) is thereby set to the output terminal Dout11 of the delay time setting circuit DC11. Accordingly, the input voltage, which has been set, is released. The reset voltage of the output terminal Dout11 is supplied to the input terminal Din11 through the resistor R.

A delay time of the falling edge of the signal input to the multi-stage delay circuit 1 is only a slight delay that is caused by the switching of the operation of the transistor, and it is significantly shorter than a delay time of the rising edge.

As described above, the multi-stage delay circuit 1 of this embodiment includes the delay circuits 10 and 11 connected in series and is thereby able to generate a signal delay time based on a delay time which is set by the delay time setting circuits. It also allows the delay time to exhibit a positive temperature coefficient with the use of the temperature characteristics of the capacitor transistors CTr10 and 11.

Further, the multi-stage delay circuit 1 of this embodiment clears the reset in the delay time setting circuit DC11 in the subsequent stage by using a signal which is delayed by the delay time setting circuit DC10. Thus, the timing to clear the reset in each stage is determined based on the output of the delay time setting circuit in the previous stage. By setting the conductivity type of the reset transistor RTr to be opposite from the conductivity type of the reset transistor RTr in the previous stage, it is possible to efficiently use the voltage range where a capacitance value of the capacitor transistor CTr is large. This enables the efficient use of the temperature characteristics of a capacitance value of the capacitor transistor CTr, which allows a delay time to exhibit a large positive temperature coefficient.

Further, the set transistor STr sets an input voltage to the input terminal Din of the delay time setting circuit before the reset transistor RTr clears the reset. The reset is cleared after an input voltage is set to the input terminal Din of the delay time setting circuit. In this embodiment, the reset is cleared by a signal to be delayed. It is thereby possible to accurately add a delay time which is set by the delay time setting circuit to the signal to be delayed. Thus, the delay time that is generated by the delay circuit of this embodiment does not contain a delay time caused by an inverter, and it is substantially determined by the delay time which is set by the delay time setting circuit. Accordingly, if a plurality of delay circuits of this embodiment are connected in multiple stages, a delay time which is generated by multi-stage delay circuit 1 is a sum of the delay time which is set by each delay time setting circuit. Further, because the delay time and the delay start timings are known exactly, it is possible to set a delay time accurately. This reduces a design work to set a delay time.

Figure 5:
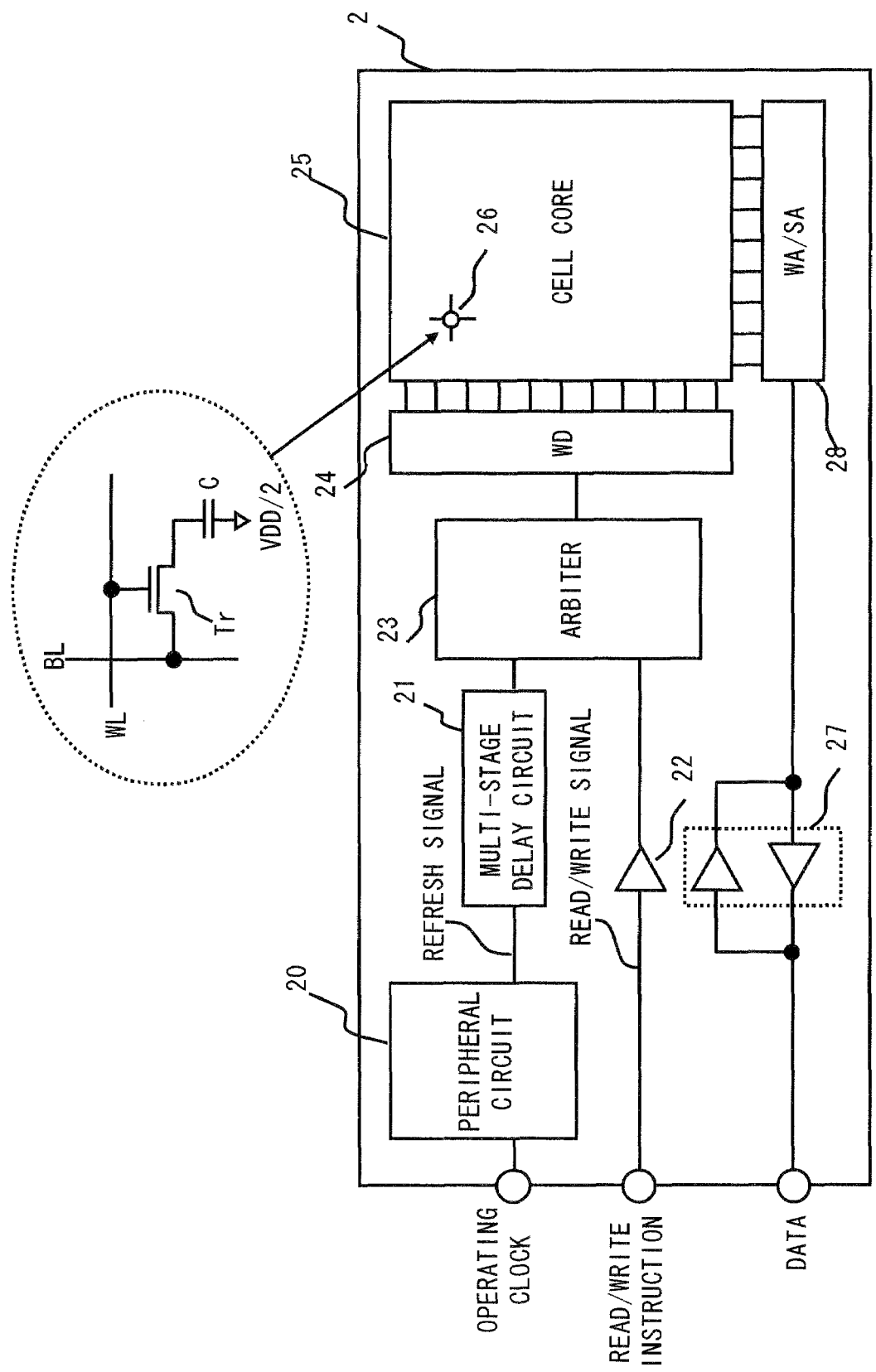
FIG. 5 is a block diagram of the configuration where a multi-stage delay circuit according to the first embodiment is used as an internal circuit of a DRAM.

The above-described multi-stage delay circuit 1 may be used as a timing adjuster of a volatile semiconductor memory such as a DRAM (Dynamic Random Access Memory), for example. The case where the multi-stage delay circuit 1 is used as an internal circuit of a DRAM is described hereinafter by way of illustration. FIG. 5 shows a block diagram of a DRAM 2.

As shown in FIG. 5, the DRAM 2 includes a peripheral circuit 20, a multi-stage delay circuit 21, an input buffer 22, an arbiter 23, a word driver (which is denoted as WD in FIG. 5) 24, a cell core 25, an input/output buffer 27, and a sense/write amplifier (which is denoted as WA/SA in FIG. 5) 28.

The peripheral circuit 20 generates a refresh period of a DRAM cell in response to an external operating clock and outputs a refresh signal. The multi-stage delay circuit 21 corresponds to the above-described multi-stage delay circuit 1. The input buffer 22 receives an external read/write instruction and sends the instruction to the arbiter 23. When the arbiter 23 receives the read/write instruction and the refresh signal at the same time, it selects either one and outputs the selected one to the word driver 24. The word driver 24 activates a DRAM cell 26 which is connected to one row among the DRAM cells 26 that are arranged lattice-like.

The DRAM cell 26 is composed of one transistor Tr and one capacitor C. A word line WL is connected to the gate of the transistor Tr. The word line WL is driven by the word driver 24. If a High level is applied to the word line WL, the transistor Tr becomes conductive to connect the bit line BL with the capacitor C. Data is thereby read or written through the bit line BL. The bit line BL is selectively connected to a sense amplifier and a write amplifier. The sense/write amplifier 28 writes the data which is input through the input/output buffer 27 to the DRAM cell 26. The sense/write amplifier 28 also outputs the data which is read through the input/output buffer 27 to the outside.

Figure 6:
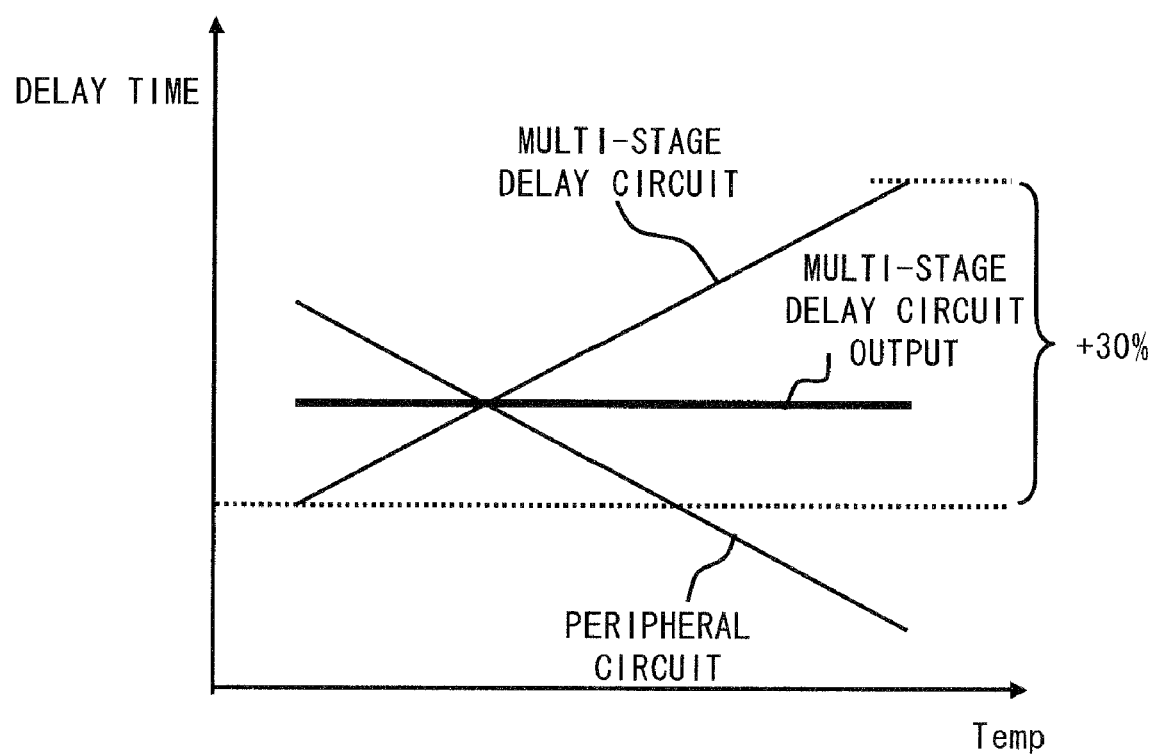
FIG. 6 is a view showing the temperature characteristics of a delay time in a peripheral circuit of a DRAM and a multi-stage delay circuit according to the first embodiment.

FIG. 6 shows the temperature characteristics in a signal delay in the peripheral circuit 20 and the multi-stage delay circuit 21. The signal delay characteristics of the peripheral circuit 20 and the multi-stage delay circuit 21 are described hereinafter. The peripheral circuit 20 is composed of a logic circuit, for example, and a delay time becomes shorter as a temperature increases. Thus, the signal delay characteristics of the peripheral circuit 20 exhibits a negative temperature coefficient. On the other hand, the signal delay characteristics of the multi-stage delay circuit 21 exhibits a positive temperature coefficient, such that a delay time becomes longer with an increase in temperature.

As shown in FIG. 6, the signal delay characteristics of the multi-stage delay circuit 21 is adjusted so that the midpoint of the signal delay characteristics of the multi-stage delay circuit 21 and the signal delay characteristics of the peripheral circuit 20 does not vary by temperature in this embodiment. An example of FIG. 6 makes an adjustment so that a signal delay time increases by about 30% between a low temperature and a high temperature.

As described above, with the use of the multi-stage delay circuit 21 of this embodiment, the refresh signal which is input to the arbiter 23 has a fixed delay time regardless of temperature. This eliminates the need for considering the temperature dependence of the timing of the refresh signal when setting the timing of the read/write instruction which is input from the outside. Further, because the timing of the refresh signal does not vary by temperature, this eliminates the need for a margin for the temperature dependence of the timing of the refresh signal, which is required in related arts. It is thereby possible to input the read/write instruction at an earlier cycle.

Second Embodiment

Figure 7:
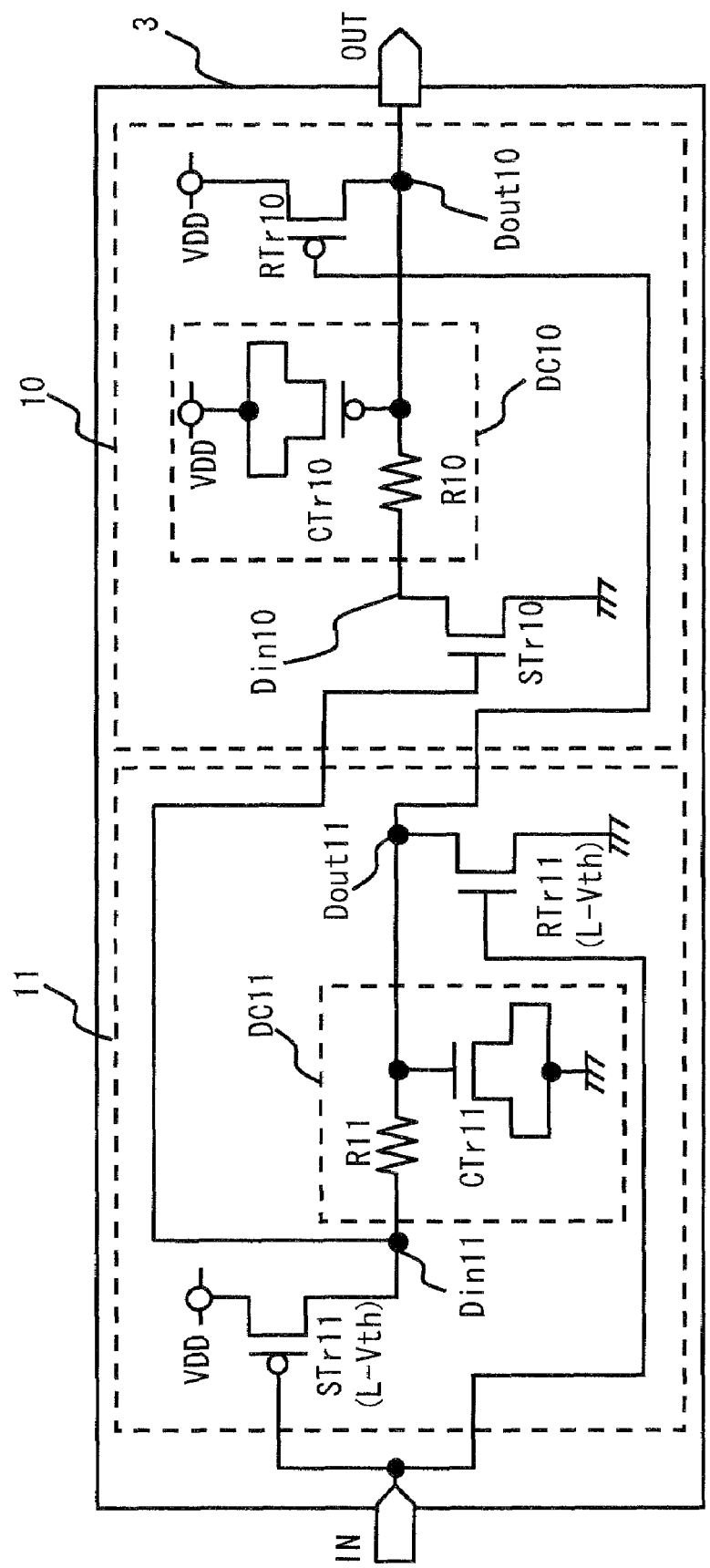
FIG. 7 is a circuit diagram of a multi-stage delay circuit according to a second embodiment of the present invention.

FIG. 7 shows a multi-stage delay circuit 3 according to a second embodiment of the present invention. As shown in FIG. 7, in the multi-stage delay circuit 3 of the second embodiment, the delay circuit 11 of the first embodiment is connected in the first stage, and the delay circuit 10 of the first embodiment is connected in the second stage. The same elements as in the first embodiment are denoted by the same reference symbols and not described in detail herein.

The multi-stage delay circuit 3 of the second embodiment is described hereinafter in detail. The set transistor STr11 of the delay circuit 11 is a transistor having a lower threshold voltage Vth than that of a standard transistor produced in a manufacturing process. An input signal IN is input to the gate of the set transistor STr11. The reset transistor RTr11 of the delay circuit 11 is a transistor having a lower threshold voltage Vth than that of a standard transistor produced in a manufacturing process. An input signal IN is also input to the gate of the reset transistor RTr11.

The set transistor STr10 of the delay circuit 10 is a transistor having a standard threshold voltage in a manufacturing process. The gate of the set transistor STr10 of the delay circuit 10 is connected with the input terminal Din11 of the delay time setting circuit DC11. The reset transistor RTr10 of the delay circuit 10 is a transistor having a standard threshold voltage in a manufacturing process. The gate of the reset transistor RTr10 of the delay circuit 10 is connected with the output terminal Dout11 of the delay time setting circuit DC11.

Figure 8:
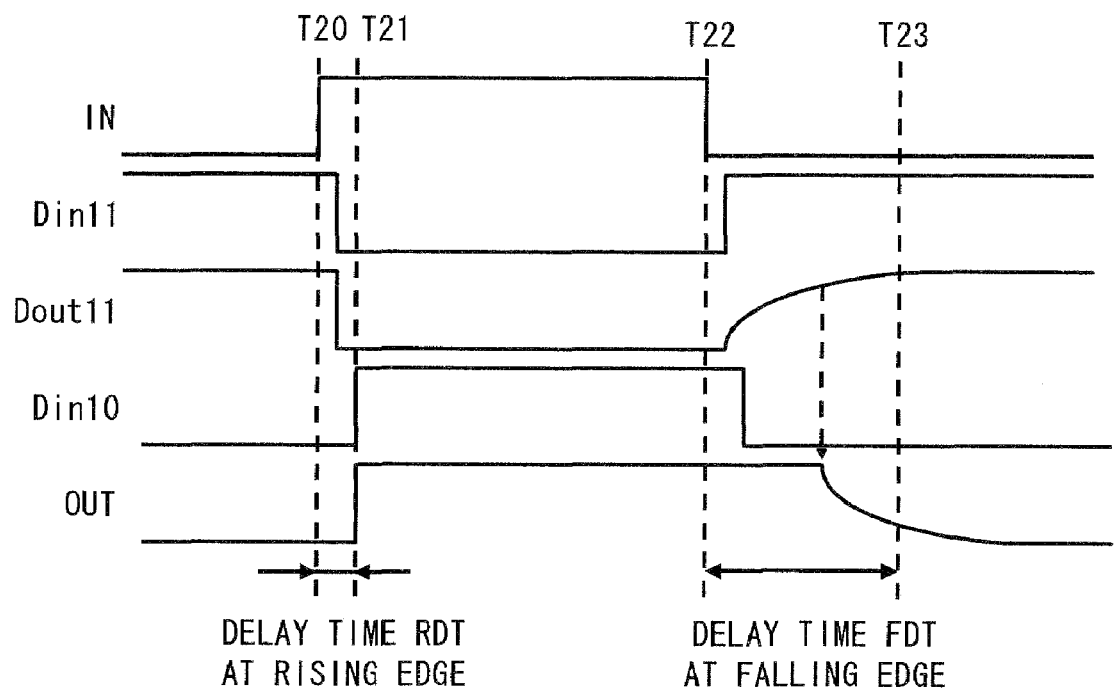
FIG. 8 is a view showing a timing chart of a multi-stage delay circuit according to the second embodiment.

FIG. 8 shows the timing chart of the operation of the multi-stage delay circuit 3 according to the second embodiment. The operation of the multi-stage delay circuit 3 is described hereinafter with reference to FIG. 8. As shown in FIG. 8, at the timing T20 when the input signal IN rises, the reset transistor RTr11 becomes conductive. After that, the set transistor STr11 becomes nonconductive. The input terminal Din11 and the output terminal Dout11 of the delay time setting circuit DC11 thereby become the ground voltage VSS.

According to the voltage of the input and output terminals of the delay time setting circuit DC11, the set transistor STr10 becomes nonconductive, and the reset transistor RTr11 becomes conductive. The output of the multi-stage delay circuit 3 is thereby High level. Accordingly, there is substantially no delay at the rising edge of the input signal and the output signal of the multi-stage delay circuit 3 according to the second embodiment.

On the other hand, at the timing T22 when the input signal rises, the set transistor STr11 becomes conductive, so that an input voltage (e.g. the power supply voltage VDD) is set to the input terminal Din11 of the delay time setting circuit DC11. After that, the reset transistor RTr11 becomes nonconductive, so that the reset is cleared. In response to the reset clear, the output signal of the delay time setting circuit DC11 starts changing.

In response to the set transistor STr11 setting the input voltage to the input terminal Din11 of the delay time setting circuit DC11, the set transistor STr10 becomes conductive. An input voltage (e.g. the ground voltage VSS) is thereby set to the input terminal Din10 of the delay time setting circuit DC10. The reset transistor RTr10 clears the reset when the output voltage of the delay time setting circuit DC11 exceeds the threshold voltage of the reset transistor RTr10. In response to the reset clear, the output signal of the delay time setting circuit DC10 starts changing.

Accordingly, the multi-stage delay circuit 3 of the second embodiment outputs a signal with a delay at the falling edge of the input signal. The delay time is a sum of the delay times which are set by the delay time setting circuits of the delay circuits 11 and 10 as in the first embodiment.

As described above, in the multi-stage delay circuit 3 of the second embodiment, the set transistor sets the input voltage of the delay time setting circuit before clearing the reset, and a change in the output signal starts upon clearing the reset. The reset is cleared in response to a signal to be delayed. The multi-stage delay circuit 3 of the second embodiment can thereby achieve the generation of a long delay time and a positive temperature coefficient of a delay time as in the first embodiment.

Third Embodiment

Figure 9:
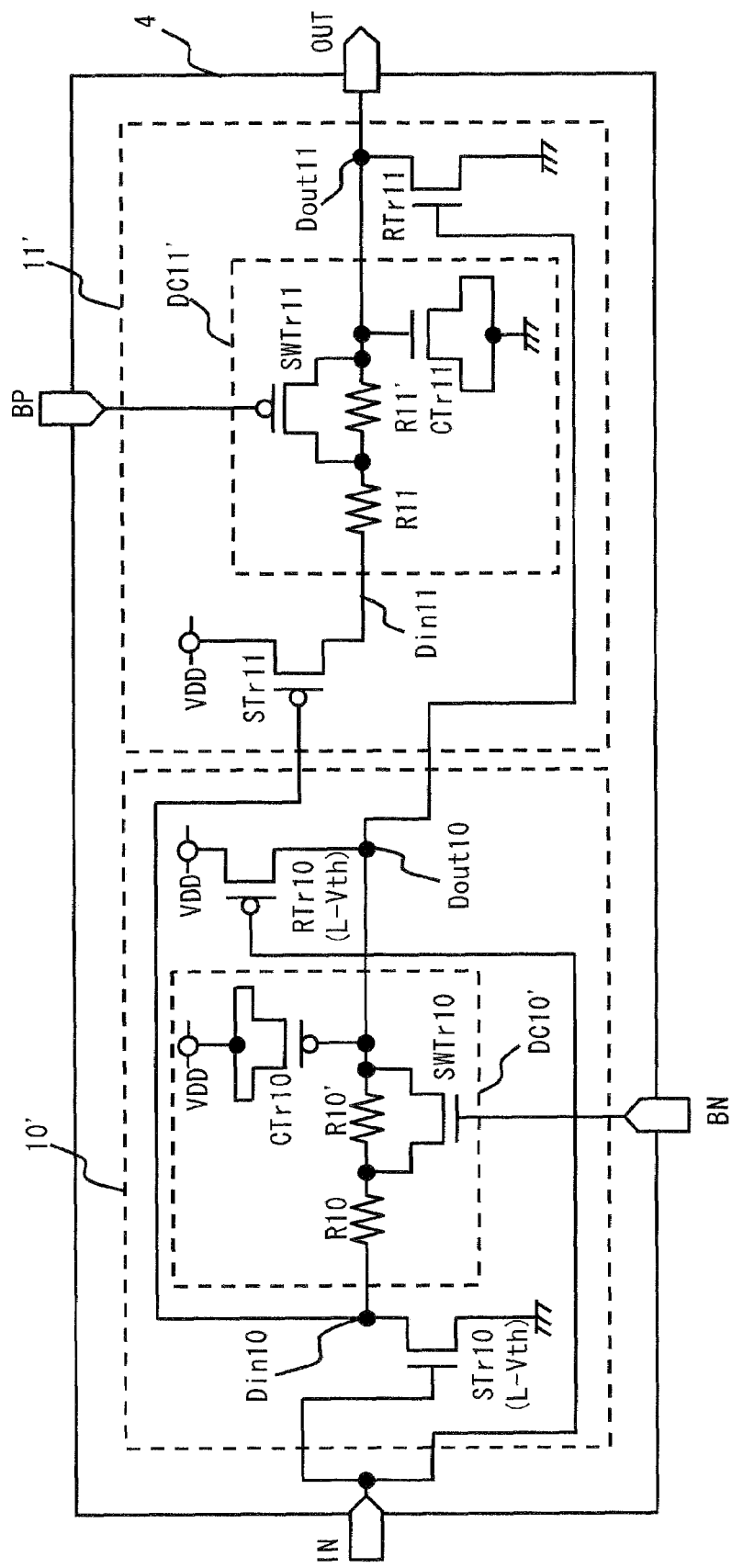
FIG. 9 is a circuit diagram of a multi-stage delay circuit according to a third embodiment of the present invention.

FIG. 9 shows a circuit diagram of a multi-stage delay circuit 4 according to a third embodiment of the present invention. The multi-stage delay circuit 4 of the third embodiment is such that a delay time adjustment function is added to the multi-stage delay circuit 1 of the first embodiment. In a delay time setting circuit DC10' of the third embodiment, a resistor R10' is connected in serial with the resistor R10. Further, a switch transistor SWTr10 is connected in parallel with the resistor R10'. The switch transistor SWTr10 serves as a switch to short-circuit the resistor R10'. In a delay time setting circuit DC11' of the third embodiment, a resistor R10' is connected in serial with the resistor R11. Further, a switch transistor SWTr11 is connected in parallel with the resistor R11'. The switch transistor SWTr11 serves as a switch to short-circuit the resistor R11'.

The resistors R10' and R11' are disabled when the switch transistors SWTr10 and SWTr11 are conductive. In this condition, the operation of the multi-stage delay circuit 4 is the same as that of the multi-stage delay circuit 1. On the other hand, the resistors R10' and R11' are enabled when the switch transistors SWTr10 and SWTr11 are nonconductive. In this condition, the operation of the multi-stage delay circuit 4 is equivalent to the case where the resistance values of the resistors R10 and R11 are larger, and it has a larger time constant than the multi-stage delay circuit 1. A delay time of an output signal thereby becomes longer.

FIG. 10 shows the relationship between a control signal of the switch transistors SWTr10 and SWTr11 and a delay amount. As shown in FIG. 10, a delay time is the longest when the switch transistors SWTr10 and SWTr11 are both OFF. A delay time is the shortest when the switch transistors SWTr10 and SWTr11 are both ON. A delay time is in between the other two when either one of the switch transistors SWTr10 and SWTr11 is ON.

As described above, the multi-stage delay circuit 4 of the third embodiment is able to change a delay time according to a control signal. It is thereby possible to perform the timing adjustment in the design phase without changing a semiconductor device. It is also possible to adjust a delay time based on a result of shipping inspection. The multi-stage delay circuit 4 of the third embodiment thereby enables more flexible setting of a delay time.

Fourth Embodiment

Figure 11:
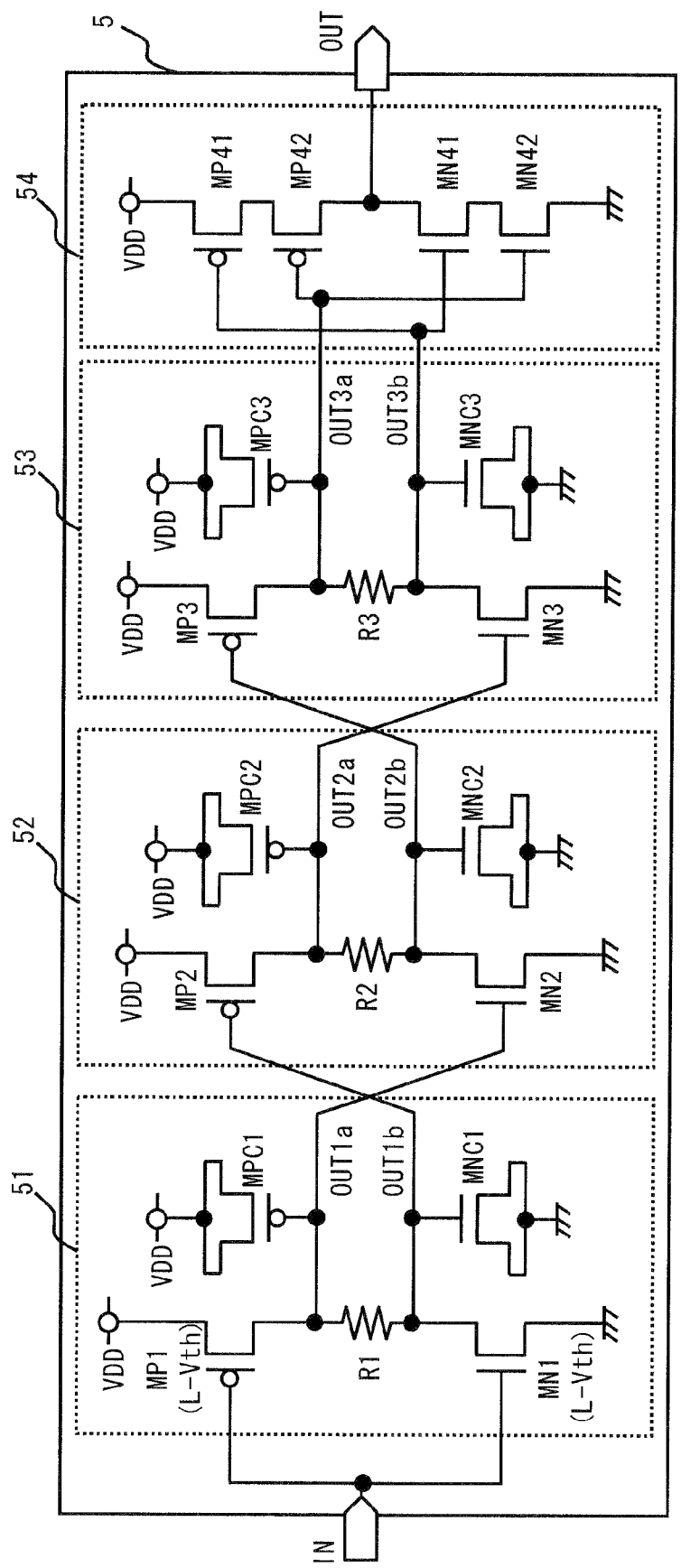
FIG. 11 is a circuit diagram of a multi-stage delay circuit according to a fourth embodiment of the present invention.

FIG. 11 shows a circuit diagram of a multi-stage delay circuit 5 according to a fourth embodiment of the present invention. As shown in FIG. 11, the multi-stage delay circuit 5 includes delay circuits 51 to 53 and an OR circuit 54. The delay circuits 51 to 53 have the same configuration, and a delay circuit is described hereinafter in detail with respect to the delay circuit 51 as an example.

In the delay circuit 51, a PMOS transistor MP1 and an NMOS transistor MN1 are connected in series between the power supply voltage VDD and the ground voltage VSS. A resistor R1 is placed between the PMOS transistor MP1 and the NMOS transistor MN1. A connection point between the PMOS transistor MP1 and the resistor R1 is a first output terminal OUT1$a$ of the delay circuit 51. The gate of a capacitor PMOS transistor MPC1, which serves as a capacitor, is connected to the first output terminal OUT1$a$. The source and the drain of the capacitor PMOS transistor MPC1 are connected to the power supply voltage VDD.

A connection point between the NMOS transistor MN1 and the resistor R1 is a second output terminal OUT1$b$ of the delay circuit 51. The gate of a capacitor NMOS transistor MNC1, which serves as a capacitor, is connected to the second output terminal OUT1$b$. The source and the drain of the capacitor NMOS transistor MNC1 are connected to the ground voltage VSS.

In the multi-stage delay circuit 5 of the fourth embodiment, the above-described delay circuits are connected in three stages, and the OR circuit 54 is connected to the output of the delay circuit 53 in the third stage. An input signal IN is input to the gate of the PMOS transistor MP1 and the gate of the NMOS transistor MN1 of the delay circuit 51 in the first stage. The PMOS transistor MP1 and the gate of the NMOS transistor MN1 are transistors having a lower threshold voltage Vth than a standard threshold in a manufacturing process.

The gate of a PMOS transistor MP2 in the delay circuit 52 in the second stage is connected to the second output terminal OUT1$b$ of the delay circuit 51. The gate of an NMOS transistor MN2 in the delay circuit 52 is connected to the first output terminal OUT1a of the delay circuit 51. The gate of a PMOS transistor MP3 in the delay circuit 53 in the third stage is connected to a second output terminal OUT2b of the delay circuit 52. The gate of an NMOS transistor MN3 in the delay circuit 53 is connected to a first output terminal OUT2a of the delay circuit 52. The outputs of the delay circuit 52 are connected to the OR circuit 54.

In the OR circuit 54, two PMOS transistors MP41 and MP42 are connected in series on the power supply voltage side, and two NMOS transistors MN41 and MN42 are connected in series on the ground voltage side. A connection point between the PMOS transistor MP42 and the NMOS transistor MN41 is connected to the output terminal OUT. The gates of the PMOS transistor MP41 and the NMOS transistor MN41 are connected to the second output terminal OUT3b of the delay circuit 53. The gates of the PMOS transistor MP42 and the NMOS transistor MN42 are connected to the first output terminal OUT3a of the delay circuit 53. In such a connection, the OR circuit 54 outputs Low level when the outputs of the delay circuit 53 are both High level and outputs High level when the outputs of the delay circuit 53 are both Low level. When either one of the outputs of the delay circuit 53 is High level, the OR circuit 54 retains the previous output.

The operation of the multi-stage delay circuit 5 is described hereinafter. In the multi-stage delay circuit 5, the NMOS transistor MN1, the PMOS transistor MP2, and the NMOS transistor MN3 serve as set transistors for the rising edge of the input signal IN. In this condition, the PMOS transistor MP1, the NMOS transistor MN2 and the PMOS transistor MP3 serve as reset transistors. The rising edge of the input signal IN is thereby delayed.

On the other hand, for the falling edge of the input signal IN, the NMOS transistor MN1, the PMOS transistor MP2, and the NMOS transistor MN3 serve as reset transistors. In this condition, the PMOS transistor MP1, the NMOS transistor MN2 and the PMOS transistor MP3 serve as set transistors. The falling edge of the input signal IN is thereby delayed.

Figure 12:
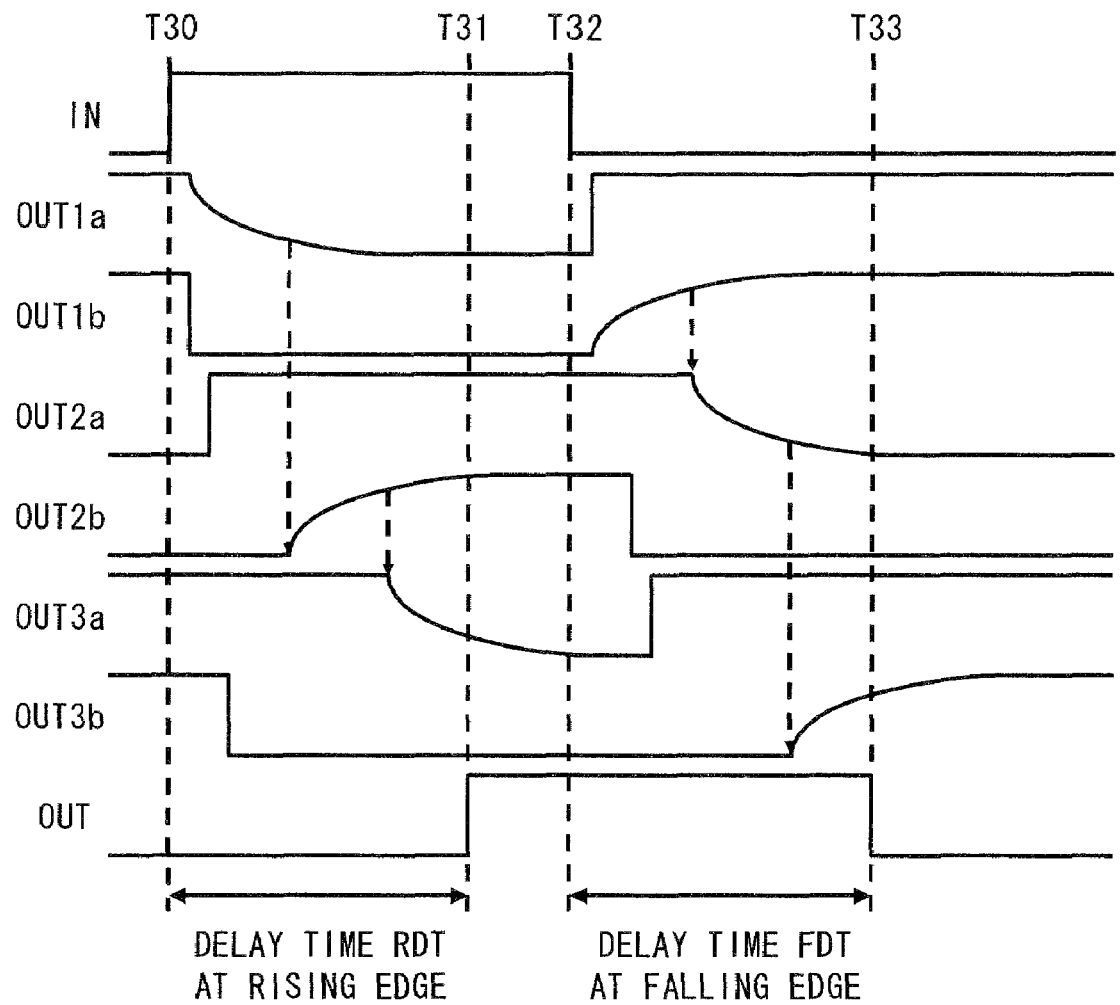
FIG. 12 is a view showing a timing chart of a multi-stage delay circuit according to the fourth embodiment.

The OR circuit 54 performs the waveform shaping of a signal which is obtained by the above-described operation. FIG. 12 shows a timing chart of the operation of the multi-stage delay circuit 5. As shown in FIG. 12, the multi-stage delay circuit 5 generates an output signal OUT, which is a signal that both the rising edge and the falling edge of the input signal IN are delayed.

As described above, the multi-stage delay circuit 5 of the fourth embodiment allows a delay to occur at both a rising edge and a falling edge. It is thereby possible to supply a signal having an accurate delay time to a circuit which uses both a rising edge and a falling edge.

Fifth Embodiment

Figure 13:
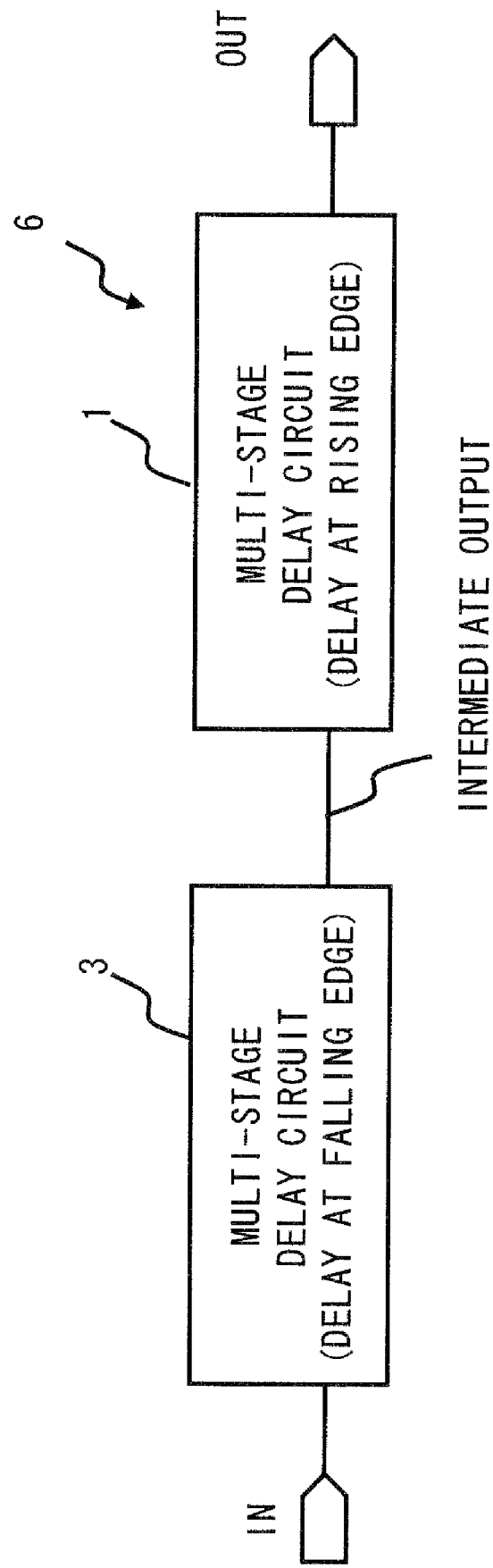
FIG. 13 is a circuit diagram of a multi-stage delay circuit according to a fifth embodiment of the present invention.
Figure 14:
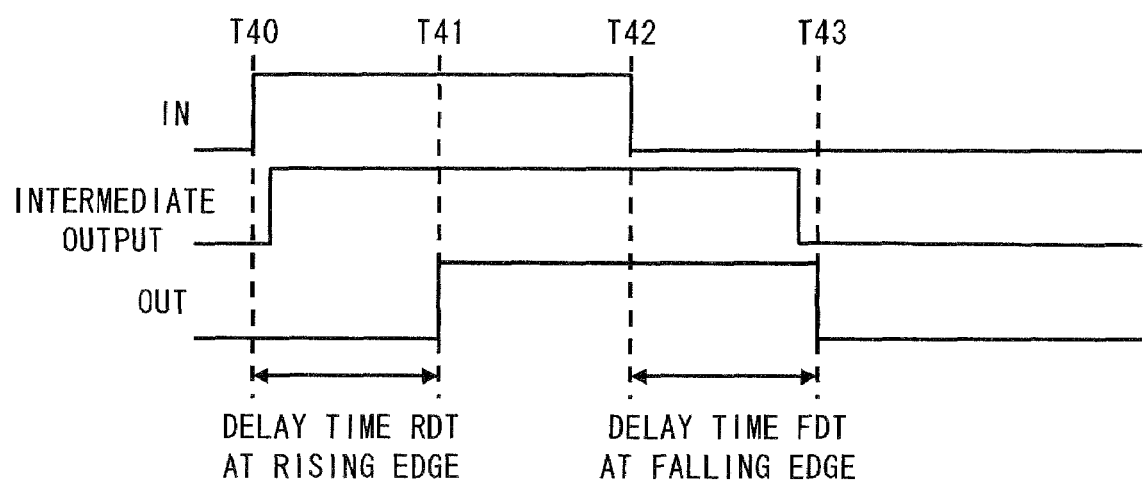
FIG. 14 is a view showing a timing chart of a multi-stage delay circuit according to the fifth embodiment.
Figure 15:
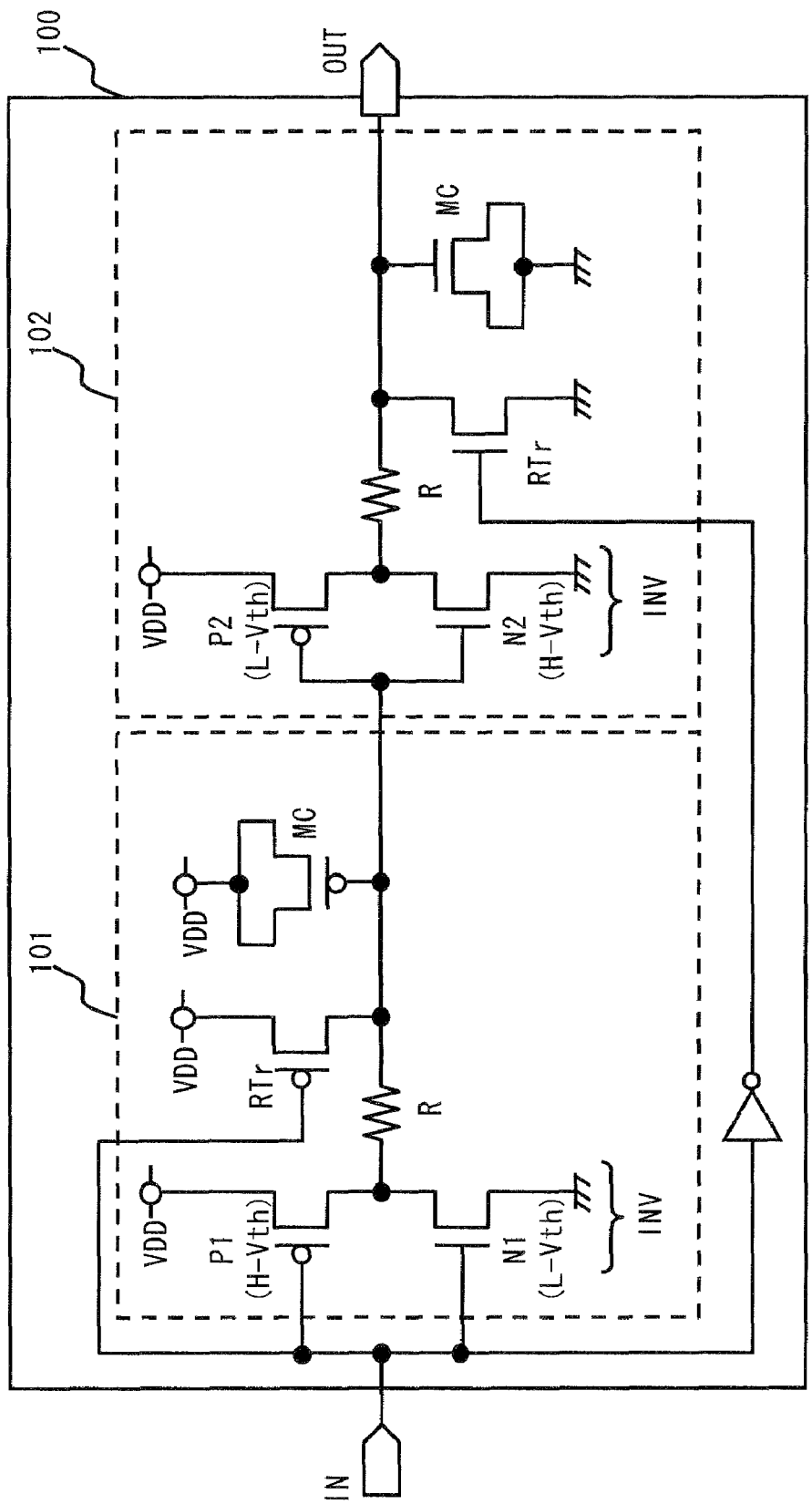
FIG. 15 is a circuit diagram of a multi-stage delay circuit according to a related art.

A multi-stage delay circuit 6 according to a fourth embodiment of the present invention is configured by connecting the multi-stage delay circuit 3 of the second embodiment and the multi-stage delay circuit 1 of the first embodiment in series. FIG. 13 shows a block diagram of the multi-stage delay circuit 6. FIG. 14 shows a timing chart of the operation of the multi-stage delay circuit 6. The waveform of an intermediate output in FIG. 14 is a signal waveform at a connection point between the multi-stage delay circuit 3 and the multi-stage delay circuit 1 in the block diagram of FIG. 13.

As shown in FIG. 14, the waveform of the intermediate output is such that the falling edge of the input signal IN is delayed. The waveform of the output signal OUT is such that the rising edge of the intermediate output is delayed.

The output signal OUT of the multi-stage delay circuit 5 of the fourth embodiment is such that both the rising edge and the falling edge of the input signal OUT are delayed. However, with reference to the output waveform of the first output terminal OUT3a of the delay circuit 53, the High-level period is short. Accordingly, an increase in the delay of the rising edge can cause the High-level period of a signal to disappear in the multi-stage delay circuit 5.

On the other hand, the multi-stage delay circuit 6 first generates an intermediate output by delaying the falling edge of an input signal in the multi-stage delay circuit 3 and then delays the rising edge of the intermediate output in the multi-stage delay circuit 1. A signal High-level period does not disappear in this configuration. Therefore, the multi-stage delay circuit 6 can largely delay a rising edge and a falling edge. It is thereby possible to set a range of a delay time to be wider than that in the other embodiments described above.

It is apparent that the present invention is not limited to the above embodiments, but may be modified and changed without departing from the scope and spirit of the invention. For example, delay circuits are not necessarily connected in series in two or three stages, and a single-stage delay circuit may be used or a plurality of delay circuits may be connected in series.

What is claimed is:

1. A delay circuit comprising:
 a delay time setting circuit to delay a signal input to an input terminal and output the signal as an output signal to an output terminal, wherein
 an output of a single first transistor is connected to an input of the delay time setting circuit to set a first voltage of said delay time setting circuit or to set an open state of said delay time setting circuit, according to a conduction state of said single first transistor, and
 an output of the delay time setting circuit is set to a second voltage or an open state according to a conduction state of another transistor of an opposite conductivity type to the first transistor,
 wherein a control terminal of a first transistor of a delay circuit in a second and subsequent stages among a plurality of delay circuits connected in series is connected to an input terminal of the delay time setting circuit in a previous stage, and a control terminal of a second transistor of the delay circuit in the second and subsequent stages is connected to an output terminal of the delay time setting circuit in a previous stage.

2. The delay circuit according to claim 1, wherein the delay time setting circuit comprises:
 a resistor; and
 a capacitor element having a capacitance value being variable according to a voltage of a connection point with the resistor.

3. The delay circuit according to claim 2, wherein the delay time setting circuit comprises:
 a switch to change a resistance value of the resistor.

4. The delay circuit according to claim 2, wherein the capacitor element is a transistor which has an opposite conductivity type of the single first transistor.

5. The delay circuit according to claim 4, wherein drain and source of the capacitor element are coupled to the second voltage.

6. The delay circuit according to claim 1, wherein the delay circuit delays either one of a rising edge and a falling edge of an input signal.

7. The delay circuit according to claim 1, wherein in a subsequent stage of a delay circuit to generate a first output signal by delaying a falling edge of an input signal, a delay circuit to generate a second output signal by delaying a rising edge of the first output signal is connected.

8. The delay circuit according to claim 1, wherein the delay circuit is used as one of circuits in a volatile semiconductor memory.

9. A delay circuit comprising:
a delay time setting circuit to set a delay time of an output signal with respect to an input signal;
a first transistor connected to an input terminal of the delay time setting circuit and configured to set a first voltage to the input terminal of the delay time setting circuit; and
a second transistor connected to an output terminal of the delay time setting circuit and configured to reset the output terminal of the delay time setting circuit to a second voltage and clear the reset of the output terminal of the delay time setting circuit after the first voltage is set,
wherein a signal generated by the same signal source is input to a control terminal of the first transistor and a control terminal of the second transistor of a delay circuit in a first stage among a plurality of delay circuits connected in series,
wherein the first and the second transistors of the delay circuit in the first stage among a plurality of delay circuits connected in series have a lower threshold voltage than that of a standard transistor in a manufacturing process.

10. A delay circuit comprising:
a delay time setting circuit to delay a signal input to an input terminal and output the signal as an output signal to an output terminal, wherein
an input of the delay time setting circuit is set to a first voltage or an open state without using a transistor of a first conductivity type, according to a conduction state of a first transistor of a second conductivity type opposite to the first conductivity type, and
an output of the delay time setting circuit is set to a second voltage or an open state according to a conduction state of a second transistor of an opposite conductivity type to the first transistor, wherein
the delay circuit is composed of a plurality of delay circuits connected with each other, and
an output of a delay circuit in one stage is not input to the delay time setting circuit of a delay circuit in a subsequent stage and is connected to a gate of the second transistor of the delay circuit in the subsequent stage.

* * * * *